(12) United States Patent
Espiau De Lamaestre

(10) Patent No.: US 9,244,207 B2
(45) Date of Patent: Jan. 26, 2016

(54) OPTICAL FREQUENCY FILTER AND A DETECTOR INCLUDING SUCH A FILTER

(71) Applicant: COMMISSARIAT A L'ENERGIE ATOMIQUE ET AUX ENERGIES ALTERNATIVES, Paris (FR)

(72) Inventor: Roch Espiau De Lamaestre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/132,429

(22) Filed: Dec. 18, 2013

(65) Prior Publication Data

US 2014/0175282 A1 Jun. 26, 2014

(30) Foreign Application Priority Data

Dec. 20, 2012 (FR) ...................................... 12 62418

(51) Int. Cl.
| | |
|---|---|
| *G02B 5/20* | (2006.01) |
| *G02B 5/18* | (2006.01) |
| *H01L 31/0232* | (2014.01) |
| *G01J 5/08* | (2006.01) |
| *H01L 31/0216* | (2014.01) |
| *G02B 6/12* | (2006.01) |

(52) U.S. Cl.
CPC .............. *G02B 5/1814* (2013.01); *G01J 5/0862* (2013.01); *G02B 5/1809* (2013.01); *G02B 5/204* (2013.01); *H01L 31/02168* (2013.01); *H01L 31/02327* (2013.01); *G02B 5/20* (2013.01); *G02B 2006/12107* (2013.01)

(58) Field of Classification Search
CPC ... G01J 5/0862; G02B 5/1814; G02B 5/1809; G02B 5/20; G02B 5/204; G02B 5/206; G02B 5/26; G02B 5/12107; H01L 31/02168; H01L 31/0237; H01L 31/02329
See application file for complete search history.

(56) References Cited

U.S. PATENT DOCUMENTS

| | | | |
|---|---|---|---|
| 2004/0047039 | A1 | 3/2004 | Wang et al. |
| 2009/0041971 | A1 | 2/2009 | Wang et al. |
| 2010/0220377 | A1* | 9/2010 | Yamada ................. G02B 5/008 359/241 |
| 2010/0328587 | A1 | 12/2010 | Yamada et al. |

FOREIGN PATENT DOCUMENTS

| | | |
|---|---|---|
| FR | 2 959 021 | 10/2011 |
| WO | 2012/105555 | 8/2012 |

* cited by examiner

*Primary Examiner* — Yara B Green
(74) *Attorney, Agent, or Firm* — Clark & Brody

(57) ABSTRACT

An optical frequency filter comprises a support layer having reflective elements formed thereon, the reflective elements defining at least one periodic grid of substantially parallel slits, the period P, the height, and the width of the slits being selected in such a manner that the reflective elements form a wavelength-selective structure for a wavelength lying in a determined range of wavelengths. The support layer material has a refractive index $n_h$ and includes inclusions of a material of refractive index $n_b$, where $n_b$ is strictly less than $n_h$. The inclusions are flush with the surface of the support layer opposite from its surface on which the reflective elements are formed, and present height $h_b$ wherein $0.5h_h \le h_b \le 1h_h$, $h_h$ being the support layer height, and width $l_b$ where $0.05P \le l_b \le 0.75P$. Each inclusion is situated at least in part between two reflective elements.

9 Claims, 4 Drawing Sheets

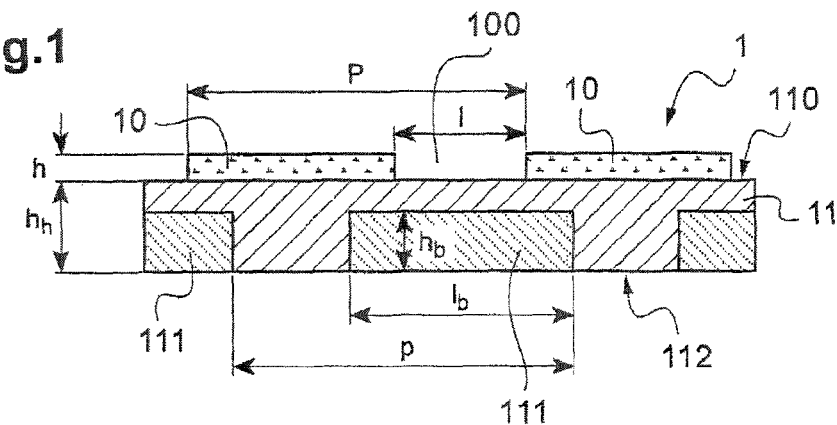
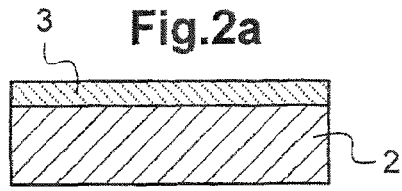
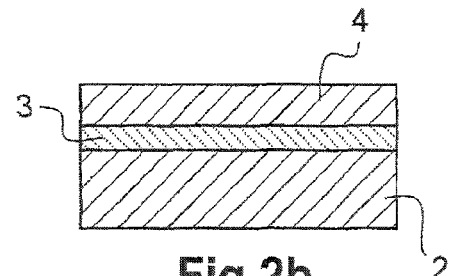
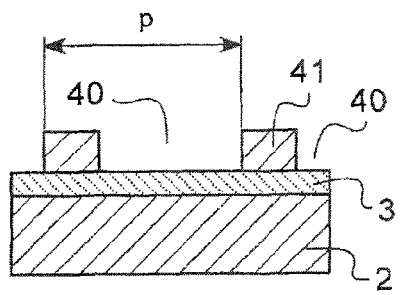
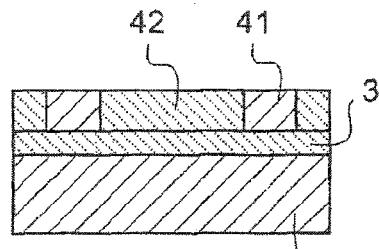
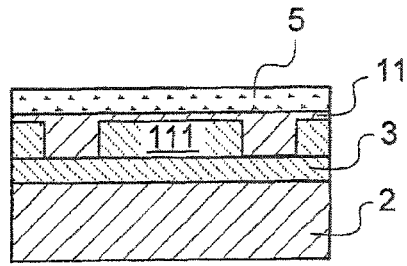
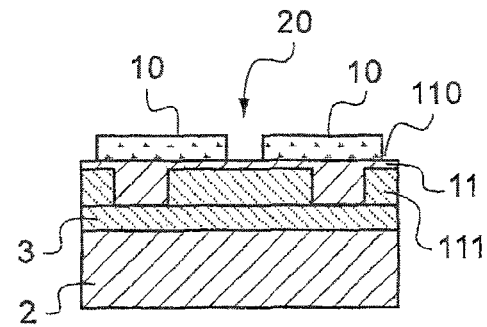

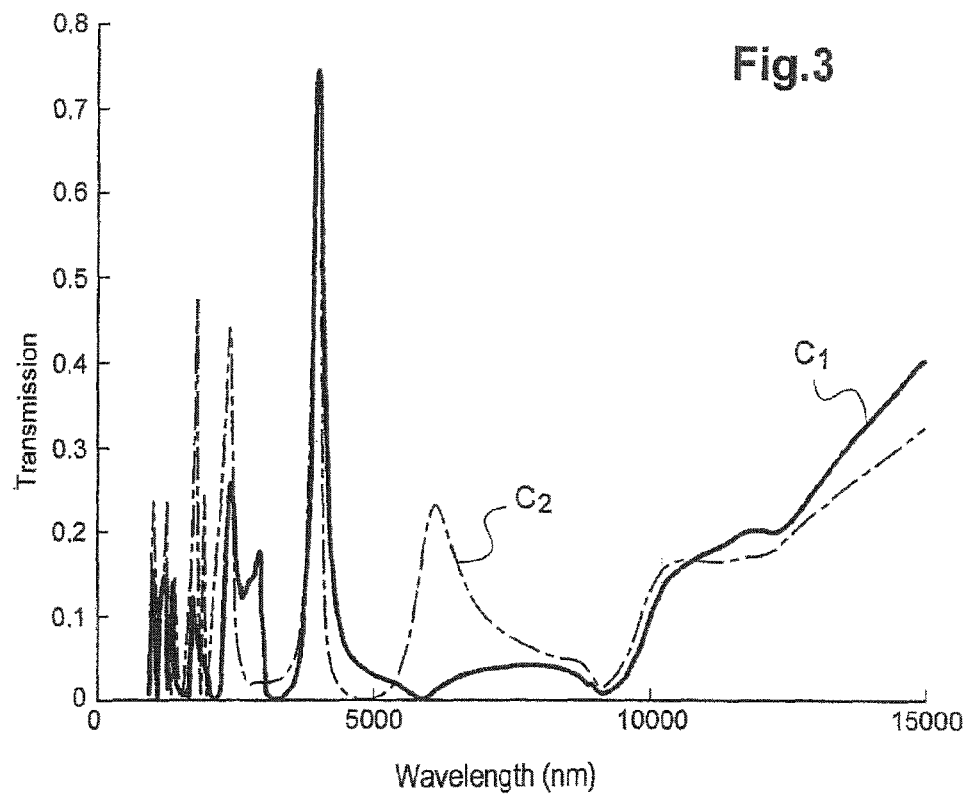
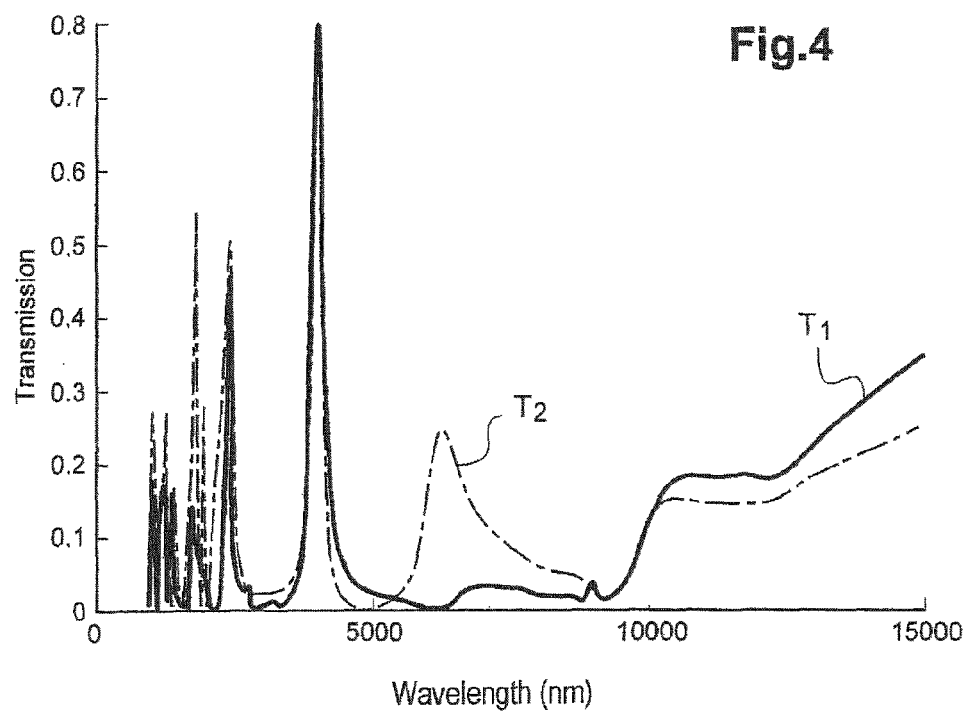

OPTICAL FREQUENCY FILTER AND A DETECTOR INCLUDING SUCH A FILTER

FIELD OF THE INVENTION

The present invention relates to optical frequency filters used in particular in the field of visible and infrared photodetection. By way of example, they may be used for the spectral detection of gases and for visible and infrared color imaging.

BACKGROUND OF THE INVENTION

Optical filters are already known that comprise a support layer having metal reflective elements formed thereon to define a grating of slits smaller than the wavelength that is to be filtered. The amplitude of transmission is adjusted both by the width and by the thickness of the slits, with the thickness being selected to be of the same order as but less than half the wavelength under consideration.

That type of filter is described in particular in the articles by J. A. Porto et al. "Transmission resonances on metallic gratings with very narrow slits", Physical Review Letters, 83, p. 2845, 1999, and by G. Vincent et al. "Large-area dielectric and metallic freestanding gratings for mid-infrared optical filtering application", Journal of Vacuum Science Technology, B 26, p. 852, 2008.

Thus, those types of filter require thick reflective elements that are sometimes suspended directly above air, so that the refractive index of the support is as close as possible to that of the incident medium (air/vacuum).

Under such conditions, such an optical filter is technologically difficult to make.

Furthermore, the spectral range over which good rejection is ensured around the main transmission peak is very limited.

Another optical filter is known that comprises reflective elements forming a conventional grating of slits, a halfwave plate supporting the grating and a medium in contact with the halfwave plate and presenting relative thereto a refractive index contrast that is as great as possible.

Such an optical filter is described in particular in Document FR 2 959 021.

With such a filter, the halfwave plate forms a waveguide under the grating of slits, the grating also being capable of exciting plasmon surface modes. The combination of the grating, of the plate, and of the large refractive index contrast makes it possible to form an electromagnetic resonator that effectively traps light in the plate before it escapes via the medium in contact with the plate.

Furthermore, that optical filter is simpler to fabricate than the suspended optical filter.

Nevertheless that filter presents certain drawbacks.

In particular, although its dimensions can be selected so as to optimize transmission at a given wavelength, the transmission spectrum of the filter presents significant peaks away from that wavelength.

This leads to poor rejection outside a rather narrow wavelength window.

That puts limitations on the use of the optical filter.

Thus, when the filter is used for hyperspectral imaging, the spectral range of interest is limited. Interference can occur between pixels of different colors, thereby complicating the color reconstruction of the image.

Also, when used in a gas sensor, it is important to distinguish spectrally between weak signals that are specific to different species. Unfortunately, the limitations of the optical filter lead to a degraded signal-to-noise ratio for detection.

OBJECT AND SUMMARY OF THE INVENTION

An object of the invention is to mitigate the drawbacks of prior art optical filters by proposing an optical frequency filter presenting very good rejection over a spectral range that is very wide, good transmission over a narrow spectral range, and good angular insensitivity, while being compact and simpler to fabricate.

Thus, the invention provides an optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths.

According to the invention, the support layer is made of a material of refractive index $n_h$ and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements.

The height $h_b$ of the inclusions is advantageously such that $0.5h_h \leq h_b \leq 0.95h_h$. Preferably, the difference between the two refractive indices $n_h$ and $n_b$ is greater than or equal to $0.25n_h$.

Likewise, that height $h_h$ of the support layer is such that:

$$0.85 \frac{\lambda}{2n_h} \leq h_h \leq 1.5 \frac{\lambda}{2n_h}$$

where $\lambda$ is a wavelength in the predetermined range of wavelengths.

Preferably, the refractive index $n_h$ is greater than or equal to $(5/3)n_{max}$, where $n_{max}$ is the highest refractive index of the surrounding materials.

Preferably, the optical filter is placed on a substrate with a layer made of a material having refractive index less than $n_h$ being arranged between the support layer and the substrate.

Advantageously, the width of the slits of said at least one periodic grating is less than one-third the period P of the grating.

Furthermore, the reflective elements are advantageously made of metal and have a height lying between the skin thickness of the metal and $\lambda/10n$, where n is the refractive index of the material included in the slits and $\lambda$ is a wavelength in the predetermined range of wavelengths.

The invention also provides a detector for detecting electromagnetic radiation in a predetermined range of wavelengths, the detector including a detection circuit sensitive to said range of wavelengths, and an optical filter of the invention.

BRIEF DESCRIPTION OF THE DRAWINGS

The invention can be better understood and other objects, advantages, and characteristics thereof appear more clearly on reading the following description which is made with reference to the accompanying drawings, in which:

FIG. 1 is a section view of a first embodiment of an optical filter of the invention;

FIGS. 2a to 2f show different steps in a method of obtaining a second embodiment of an optical filter of the invention;

FIGS. 3 to 5 show two transmission responses each, one for an optical filter of the invention and the other for an optical filter in accordance with the second embodiment;

MORE DETAILED DESCRIPTION

Figure 5:
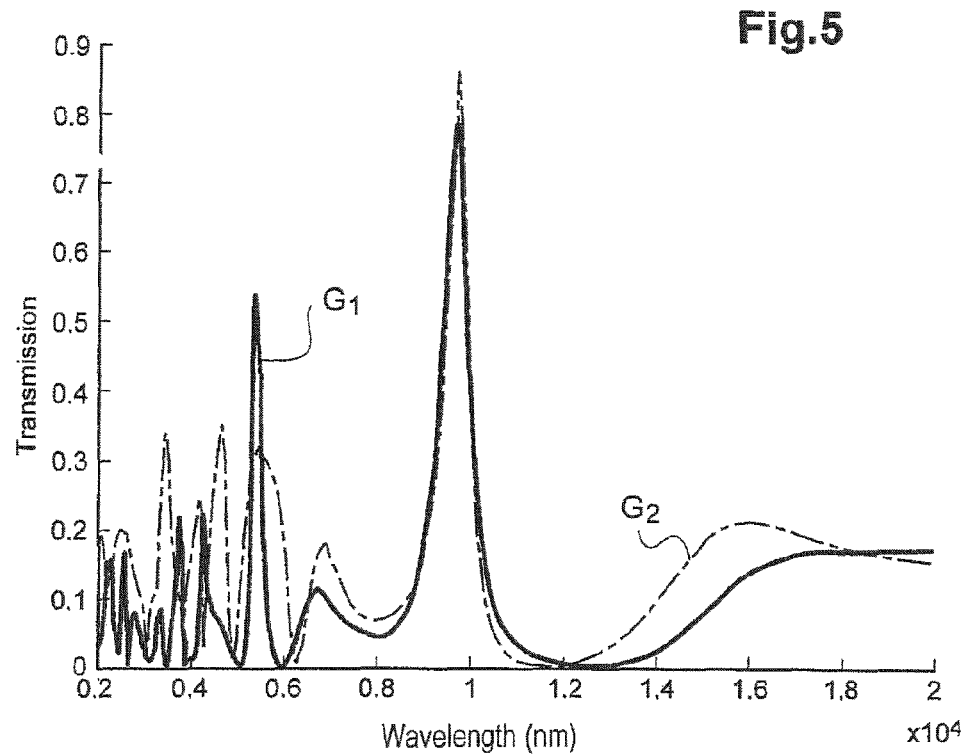

Elements that are shown in more than one of the figures are given the same references in each of them.

FIG. 1 shows an example of an optical filter 1 of the invention in section view.

The frequency filter 1 includes reflective elements 10 that are formed on one face 110 of a support layer 11 made of dielectric material.

The reflective elements 10 are separated by slits of width l. These slits form at least one grating of substantially parallel slits, the grating being periodic of period P.

Thus, the filter 1 may have only a single grating of parallel slits, the elements 10 then forming lines or strips.

It is also possible for the filter 1 to have two gratings of slits that are periodic and orthogonal. Under such circumstances, the reflective element 10 would be in the form of rectangular slabs.

The slits 100 go down to the layer 11. In other words, the bottoms of the slits 100 are constituted by portions of the face 110 of the layer 11.

The period P, the width l, and the height h of the slits are selected so that the reflective elements 10 form a structure that is selective in transmission for a wavelength lying in a determined range of wavelengths.

For selecting these parameters, reference may be made in particular to the article by J. Le Perchec et al., Optics Express, Vol. 19, Issue 17, pp. 15720-15731 (2011).

Thus, the width l of the slits should be selected to be less than P/3. In general, the smaller the width l, the greater the selectivity of the filter in wavelength.

Furthermore, the value of the period P is determined so as to adjust the resonant wavelength on the selected wavelength of interest.

In particular, the reflective elements 10 may be made of metal, e.g. of aluminum, silver, gold, or copper.

They could also be made of a material capable of propagating surface waves, such as an absorbent material. This material may thus be silicon in the ultraviolet or heavily n- or p-doped silicon in the infrared.

The height h of the reflective elements 10 or of the slits 100 is preferably the same for all of the elements 10.

In particular, it lies between the thickness of the skin of the metal and about $\lambda/10n$, where n is the refractive index of the material included in the slits, specifically air. By way of example, the height of a reflective element made of aluminum may lie in the range approximately 15 nanometers (nm) to 500 nm depending on whether the wavelength is in the visible or the infrared. For example, it would be 25 nm for a reflective element made of gold for use at a wavelength of 4 micrometers (μm).

The layer 11 is made of a material presenting a high refractive index $n_h$. This index is preferably greater than or equal to $(5/3)n_{max}$, where $n_{max}$ is the highest refractive index of the surrounding materials.

In the example shown in FIG. 1, the layer 11 does not rest on any substrate. Thus, the medium surrounding the filter 1 is air.

This embodiment is illustrated in particular in the following articles: "Guided mode resonance in sub-wavelength metallodielectric freestanding grating for bandpass filtering" by E. Sakat, G. Vincent, P. Ghenuche, N. Bardou, S. Collin, F. Pardo, J.-L. Pelouard, R. Haïdar, Opt. Lett. 36, 3054 (2011), and "Freestanding sub-wavelength metallic gratings for snapshot multispectral imaging" by R. Haïdar, G. Vincent, S. Collin, N. Bardou, N. Guérineau, J. Deschamps, J.-L. Pelouard, Appl. Phys. Lett. 96, 221104 (2010).

The height $h_h$ of the layer 11 preferably lies in the range approximately $0.85\lambda/2n_h$ and approximately $1.5\lambda/2n_h$, where $\lambda$ is a wavelength in the predetermined range of wavelengths.

In another embodiment, the lower surrounding medium may constitute a substrate. It may be made of a material having a refractive index that is less than the refractive index of the material of the layer 11. If it is made of material presenting an index close to $n_h$, or even higher, then a quarterwave layer made of a material having an index lower than $n_h$ should be interposed between the filter 1 and the substrate.

Inclusions 111 are provided in this layer 11, the inclusions being made of a material having a refractive index $n_b$ that is strictly less than the index $n_h$ of the layer 11.

The difference between the indices $n_h$ and $n_b$ is preferably greater than or equal to $0.25n_h$.

In general, it is found that the rejection of the filter is improved over a broad spectral range with increasing difference between the indices $n_h$ and $n_b$.

Thus, the layer 11 is structured by replacing the material having a high refractive index $n_h$ in the zones 111 of the layer 11 with a material having a low refractive index $n_b$.

When structured in this way, the layer 11 conserves a waveguide function, which function is adjusted by the inclusions ill so as to improve filtering performance.

These inclusions ill extend to the surface 112 of the layer 11 that is opposite from the face 110 that supports the reflective elements 10. Thus, in this embodiment, the inclusions 111 are flush with this surface 112.

Tests have been performed that show that this embodiment is the most favorable in terms of rejection. Nevertheless, it is possible to envisage the presence of a layer of material on the surface 112, in particular if its thickness is less than $0.05h_h$.

That is why, in the context of the present patent application, the term "flush" extends to include both inclusions that do indeed reach the surface 112 and also inclusions that are separated from this outside surface of the layer 11 by a fine layer of material.

In the example shown in FIG. 1, these inclusions 111 are distributed in the layer 11 at a period p equal to P.

Other embodiments could be envisaged.

In this example, the inclusions 111 are in the form of continuous strips.

The materials constituting the layer 11 and the inclusions 111 are materials that are dielectric in the optical meaning of the term, i.e. they absorb little or no light at the wavelength of interest.

The height $h_b$ of the inclusions 111 lies in the range $0.5h_h$ to $h_h$ or advantageously in the range $0.5h_h$ to $0.95h_h$. Thus, the height $h_b$ of the inclusions may be equal to the height $h_h$ of the layer 11. Under such circumstances, the layer 11 is made up of a periodic alternation between strips of material having a refractive index $n_h$ and strips of material having a refractive index $n_b$, these strips all having the same thickness.

Furthermore, the width $l_b$ of the inclusions 111 lies in the range 0.05P to 0.75P.

In combination, these two ranges of values for $h_b$ and $l_b$ serve to improve rejection outside the transmission range while having good transmission in the desired range.

Preferably, the height $h_b$ and the width $l_b$ of the inclusions 111 are selected as follows.

The height $h_b$ of the inclusions 111 should lie in the range $0.7h_h$ and $0.95h_h$, and in particular in the range $0.8h_h$ to $0.9h_h$, for example it may be equal to about $0.85h_h$.

The width $l_b$ of the inclusions preferably lies in the range 0.1P to 0.7P, and more particularly in the range 0.15P to 0.55P. Typical values that are used may be about 0.3P or 0.5P.

Rejection is thus further improved outside the transmission range without transmission being degraded in the transmission range, when the ranges of values for $h_b$ and $l_b$ are reduced around the above-mentioned optimum values.

It should also be observed that an inclusion is not positioned arbitrarily relative to the reflective elements 10. Each inclusion 111 is positioned so as to be situated at least in part between two reflective elements. Naturally, this positioning is considered in the thickness of the filter, i.e. the inclusions 111 are indeed situated below the reflective elements 10, but they are at least in part in register with a slit 100.

In general, the reference positioning between the slits and the inclusions is mutual centering between them.

Nevertheless, a certain amount of tolerance exists for this relative positioning.

Thus, the filter of the invention is not restricted to the embodiment shown in FIG. 1, and each inclusion 111 could be offset so as to be in register only in part with a slit 100.

Tests have shown that the inclusions shown in FIG. 1 can be offset by about 10% of the period P without the rejection of the filter being greatly disturbed. This is an offset between the center of an inclusion and the center of a slit. These tests have been performed in particular on a filter of the invention as described below with reference to FIG. 3.

This value is quite large and makes fabrication robust in the face of the alignment errors that are commonly encountered in microfabrication (typically, ultraviolet (UV) lithography presents an alignment error of a few tens of nm).

By way of example, the following materials could be used.

When the optical filter of the invention is for a wavelength situated in the visible, the material of high index $n_h$ may for example be made of $Si_3N_4$, SiC, CdS, or indeed ZnS. The material of low index $n_b$ of the inclusions 111 may then be $SiO_2$, $CaF_2$, or indeed SiON.

Thus, in the visible, the minimum value of the index $n_h$ of the high index materials is about 2 (as for $Si_3N_4$), and the maximum value of the index $n_b$ of the low index materials is about 1.5 (as for $SiO_2$). This does indeed correspond to a difference between $n_h$ and $n_b$ that is greater than or equal to $0.25n_h$.

When the filter of the invention is for wavelengths situated in the infrared, the material of high index $n_h$ may be selected from semiconductor materials having an optical cutoff wavelength that is shorter than the wavelength of interest. For example, the material may be silicon for wavelengths longer than 1.1 μm or germanium for wavelengths longer than 1.5 μm. Other high index semiconductor materials of type II-V or of type II-VI may also be suitable. In this respect, it should be observed that semiconductor materials presenting a small gap present refractive indices that are quite high, of the order of 3 to 4.

Furthermore, the above-mentioned high-index materials for a filter for use at a wavelength situated in the visible are also suitable for a filter for use with a wavelength situated in the infrared.

The materials of low refractive index $n_b$ may for example be $SiO_2$, MgO, $Al_2O_3$, $ZrO_2$, $TiO_2$, or indeed ZnO, or indeed nitrides or sulfides.

In preferred manner, for wavelengths of interest shorter than 8 μm, it is advantageous to select a layer 11 made of silicon with inclusions made of $SiO_2$. This combination of materials makes it possible to make filters at low cost, using integrated fabrication on a technological platform making use of equipment for deposition, lithography, etching, cleaning, and annealing devices presenting patterns of micrometer and/or submicrometer size.

Nevertheless, for wavelengths of interest situated in the range 8 μm to 12 μm, it is advantageous to select germanium for the material of the layer 11 and ZnS for the inclusions. Silicon oxide is a material that is highly absorbent at a wavelength of about 8 μm, which makes it preferable to use some other material for wavelengths longer than 8 μm, and in particular in the 8 μm-12 μm band (known as band III, or the far infrared). In general, the situation is similar for all oxides and nitrides. In contrast, sulfides make it possible to overcome this difficulty, even if they present a refractive index that is higher. It should be observed that sulfides may be used as a material of high index in the visible, or as a material of low index in the infrared.

In general, the difference between the indices $n_b$ and $n_h$ will be smaller in the visible than in the infrared.

This comes from the difficulty of finding a material of high index (in particular higher than 3) that is also transparent in the visible range, in combination with the fact that materials of low index do not change relative to the IR range (typically $SiO_2$ with an index of 1.5).

Rejection will therefore be weaker in the visible.

A method of making a second embodiment of the optical filter of the invention is described below with reference to FIGS. 2a to 2f.

FIG. 2a shows a first step of the method in which a layer of silicon oxide 3 is deposited on a silicon substrate 2.

This deposition may be performed in particular using plasma enhanced chemical vapor deposition (PECVD) or thermal oxidation at high temperature (about 1000° C.).

FIG. 2b shows a second step of the method in which a layer 4 of silicon is deposited on the layer 3, e.g. by PECVD.

FIG. 2c shows a step of lithography followed by a step of etching to etch the layer 4 locally, this etching being stopped by the layer 3.

This etching step, e.g. reactive plasma etching, serves to provide empty zones 40 between zones 41 of silicon.

These zones 40 are distributed periodically, at a period p.

The lithography technique that is used is preferably a deep ultraviolet (DW) technique.

FIG. 2d shows a step of the method in which a layer of $SiO_2$ is deposited on the layer 3 in such a manner as to encapsulate the remaining material of the layer 4.

The thickness of the deposited layer of $SiO_2$ is greater than the height of the zones 40 or 41. After it has been deposited, a step of mechanical-chemical polishing is performed so that the resulting layer presents the same height as the zones 41.

The layer obtained on the layer 3 thus has alternating zones 42 made of $SiO_2$ and zones 41 made of silicon.

FIG. 2e shows two other steps of the method of the invention.

The first consists in depositing an additional layer of silicon on the zones 40 and 41.

This step serves to obtain a silicon layer 11 in which inclusions 111 of SiO$_2$ are present.

This additional layer of silicon may be deposited in particular by a PECVD type technique.

The second step consists in depositing a metal layer 5 on the layer 11, in particular a layer of aluminum.

Under certain circumstances, another layer (not shown in FIG. 2e) may be deposited between the layer 11 and the layer 5. This layer has a diffusion barrier function. This layer may be useful if heat treatment is performed after depositing the metal layer 5 leading to interdiffusion at the interface between the layers 5 and 11.

This barrier layer may in particular be made of silicon nitride.

FIG. 2f shows a last step of the method of the invention, which consists in a step of lithography followed by etching the layer 5, e.g. reactive plasma etching.

This etching step leads to obtaining reflective elements 10 on the face 110 of the layer 11.

Thus, the resulting filter 20 differs from the filter 1 shown in FIG. 1 in that it includes a silicon substrate 2, with a layer 3 of silicon oxide being provided between the layer 11 and the substrate 2.

The performance of a filter of the type shown in Document FR 2 959 021 with a filter of the invention, of the same type as the optical filter shown in FIG. 2f is compared below with reference to FIGS. 3 to 5.

Thus, FIG. 3 has two curves C$_1$ and C$_2$, the curve C$_1$ showing the transmission response of an optical filter of the invention as a function of wavelength, while the curve C$_2$ is a similar curve for an optical filter in accordance with Document FR 2 959 021.

Both of those filters had reflective elements defining a periodic grating of parallel slits, of period P, of height h, and of width l. The reflective elements were made of aluminum and were in the form of parallel strips.

The height h of the slits was 50 nm. The period P of the filter of the invention was 2000 nm, while the period of the prior art filter was 1700 nm. In both cases, the width l of the slits was selected to be equal to 0.2P. That led to l having a value equal to 400 nm for the filter of the invention and to 340 nm for the prior art filter.

The reflective elements were formed on a support layer of height equal to 575 nm.

In both filters, the support layer was arranged on a layer of SiO$_2$ presenting a height of 700 nm, the layer of SiO$_2$ itself being arranged on a silicon substrate.

In the prior art filter, the support layer was made of silicon only.

In the filter of the invention, the support layer was made of silicon and it also included inclusions of SiO$_2$. The inclusions were distributed in the layer 11 at a period p equal to 2000 nm, each of the inclusions being situated in register with a slit between two reflective elements.

The height h$_b$ of the inclusions was selected to be equal to 0.8h$_h$, where h$_h$ was the height of the support layer, corresponding to a value of 460 nm. The width l$_b$ of the inclusions was selected to be equal to 0.2P, corresponding to a value of 400 nm.

As can be seen in FIG. 3, both filters had a resonance wavelength of 4 µm.

Furthermore, it can be seen from FIG. 3 that, in curve C$_2$, the width of the filter spectral band is 0.75λ for a rejection ratio of 10 decibels (dB) and of 0.9λ for a rejection ratio of 5 dB.

For the curve C$_1$, the width of the filter spectral band is 1.70λ for a rejection ratio of 10 dB, and it is equal to about 2λ for a rejection ratio of 5 dB.

Thus, FIG. 3 shows that the filter of the invention makes it possible to substantially improve the rejection spectral width since it is doubled, in particular in the long wavelength range, i.e. wavelengths longer than the resonance wavelength of the filter.

FIG. 4 shows two curves T$_1$ and T$_2$, the curve T$_1$ showing the transmission response of an optical filter of the invention as a function of wavelength, while the curve T$_2$ is a similar curve for an optical filter in accordance with Document FR 2 959 021.

Those two filters had the same structures as the filters described with reference to FIG. 3, except for a few characteristics as specified below.

Thus, the filter in accordance with Document FR 2 959 021 was identical to that corresponding to curve C$_2$. The curves C$_2$ and T$_2$ are identical.

The period P of the optical filter of the invention presented reflective elements of aluminum in the form of strips distributed at a period P equal to 1850 nm. The width l of the slits was still 0.2P, thus corresponding to a value of 370 nm.

Furthermore, the height h$_h$ of the layers supporting the reflective elements and made of silicon was equal to 725 nm.

The inclusions of SiO$_2$ had the configuration of FIG. 1. Their height h$_b$ was equal to 0.8h$_h$, corresponding to a value of 580 nm. The width l$_b$ of the inclusions was equal to 0.3P, which corresponds to a value of 555 nm.

It can be seen that the height of the support layer, equal to 575 nm in the prior art filter, corresponds substantially to a value of 0.99λ/2n$_h$. For the filter of the invention, the height h$_h$ of 725 nm corresponds to a value of 1.24λ/2n$_h$.

On comparing the curves T$_1$ and T$_2$, it can be seen that the filter of the invention still presents good rejection over a larger spectral band than does the prior art filter.

Thus, the curve T$_1$ shows that the filter of the invention presents rejection of at least 13.7 dB over a filter spectral band of about 0.74λ, while the corresponding band for the curve T$_2$ is about 1.73λ.

Furthermore, if the curves C$_1$ and T$_1$ are compared, it can be seen that the increase in the height h$_h$ of the support layer also makes it possible to increase the width of the spectral band over which a given level of rejection is obtained.

The table below gives a comparison between each of the two filters of the invention corresponding to curves C$_1$ and T$_1$ and the prior art filter corresponding to curves C$_2$ and T$_2$, the table giving the spectral band width for rejection ratios of 5 dB, 10 dB, and 13.7 dB.

|  | C$_1$ | T$_1$ | Prior art |
| --- | --- | --- | --- |
| 5 dB | 2.71λ | 2.73λ | 0.93λ |
| 10 dB | 1.72λ | 1.82λ | 0.8λ |
| 13.7 dB | 1.07λ | 1.73λ | 0.73λ |

Furthermore, comparing curves C$_1$ and T$_1$ shows that the increase in the width of the filter spectral band for a given rejection ratio that results from increasing the height of the support layer is obtained while conserving the properties of the main transmission peak at the resonance wavelength, i.e. 4 µm. In particular, the maximum transmission value and the half-height width in curves C$_1$ and T$_1$ are substantially unchanged.

However, comparing curves C$_1$ and T$_1$ shows that the maximum transmission value for the secondary peak situated at about 2.425 nm is greater for the curve $T_1$ than for the curve $C_1$. This maximum value is about 0.53 for the curve $T_1$ and 0.27 for the curve $C_1$.

A selection between the two types of filter can be made as a function of the particular application that is envisaged.

FIG. 5 has two curves $G_1$ and $G_2$, the curve $G_1$ showing the transmission response of an optical filter of the invention as a function of wavelength, while the curve $G_2$ is a similar curve for an optical filter in accordance with Document FR 2 959 021.

Those two filters had reflective elements made of aluminum separated by a grating of slits of period P, of height h, and of width l.

In both filters, the period P was selected so that the value of the resonance wavelength was equal to 10 µm.

For the filter of the invention, P was equal to 3350 nm whereas for the filter in accordance with Document FR 2 959 021, the value of P was equal to 3570 nm. For both of them, the height h of the slits was 50 nm and their width was 0.2P. That led to a value for l equal to 670 nm for the filter of the invention and to 714 nm for the filter of the prior art.

In both filters, the layer supporting the reflective elements was placed on a layer of ZnS presenting a height of 1125 nm, the ZnS layer itself being supported by a silicon substrate.

For the prior art filter, the support layer was made of germanium and it had a height of 1250 nm.

For the optical filter of the invention, the support layer had a height $h_h$ of 1500 nm. It was made of germanium with inclusions of ZnS. The configuration of those inclusions was as shown in FIG. 1.

The height $h_b$ of the inclusions was equal to $0.85h_h$, corresponding to a value of 1275 nm.

The width $l_b$ of the inclusions was equal to 0.3P, corresponding to a value of 1005 nm.

FIG. 5 shows that for given rejection, e.g. about 8 dB, the corresponding spectral band presents a greater width for the curve $G_1$ than for the curve $G_2$ (a value of 1.06λ, as compared with 0.76λ).

Furthermore, tests were performed to determine the influence of the angle of incidence of the light on the filter.

Those tests were performed using the filters corresponding to curves $T_1$ and $T_2$.

They reveal that both filters had the same lack of sensitivity to angle of incidence. Thus, for angles of incidence extending as far as 10°, the peak corresponding to the maximum transmission value was always obtained for a wavelength value of 4 µm.

Furthermore, those tests show that the width extension of the spectral band obtained with the filter of the invention for given rejection is insensitive to the angle of incidence of light to a value of 10°.

The curves $C_1$, $T_1$, and $G_1$ shown in FIGS. 3 to 5 show that for wavelengths longer than 10 µm for the curves $C_1$ and $T_1$ and longer than 14 µm for the curve $G_1$, the transmission values increased significantly.

To limit that phenomenon, it is possible to envisage doping the semiconductor material used for fabricating the filter, and more particularly the top layer of the substrate.

Figure 6:
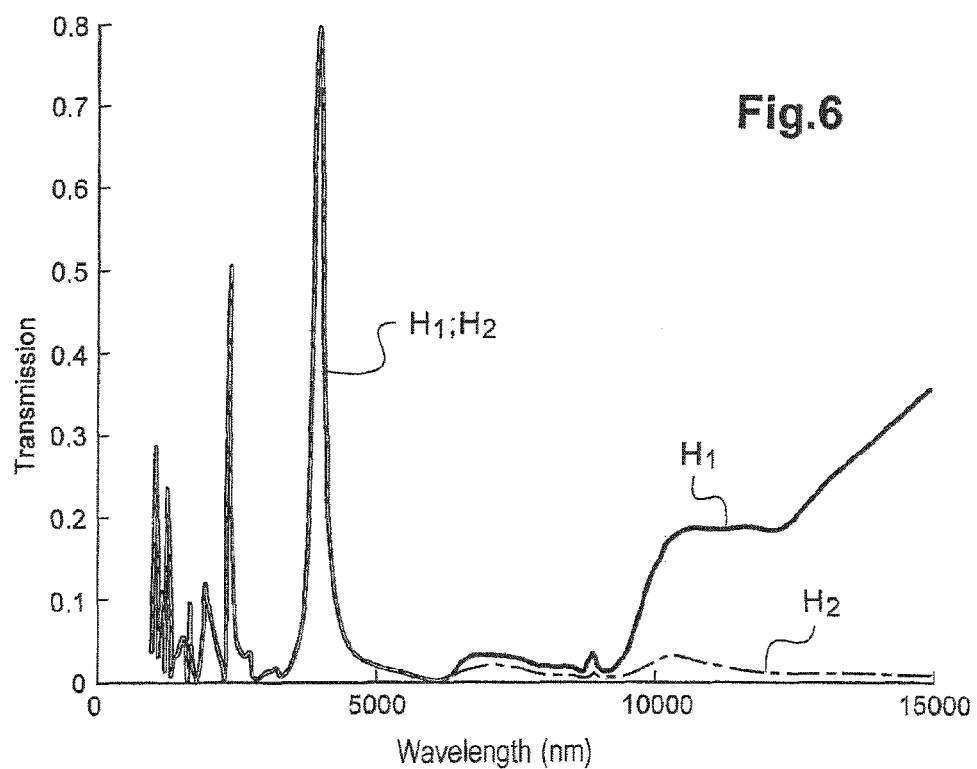
FIG. 6 shows two transmission responses, one for an optical filter of the invention and the other for a filter that is similar but in which a doped semiconductor plate is inserted.

Thus, FIG. 6 has two curves $H_1$ and $H_2$. The curve $H_1$ shows the transmission response of the optical filter of the invention corresponding to the curve $T_1$. Thus, the curves $H_1$ and $T_1$ are identical. The curve $H_2$ corresponds to the same filter, in which a plate made of n-doped silicon was inserted between the silicon substrate and the layer of $SiO_2$. In practice, that plate corresponds to the top portion of the substrate being doped.

The plate had a height of 2 µm. Comparing the curves $H_1$ and $H_2$ shows that the plate serves to limit transmission strongly at wavelengths longer than 9 µm.

It can also be seen that inserting the plate of doped silicon leads to a decrease in the value of the main transmission peak at the wavelength of 4 µm. However this decrease is only 20%. It is therefore acceptable in terms of proper operation of the filter, given the limit on transmission for long wavelengths.

Figure 7:
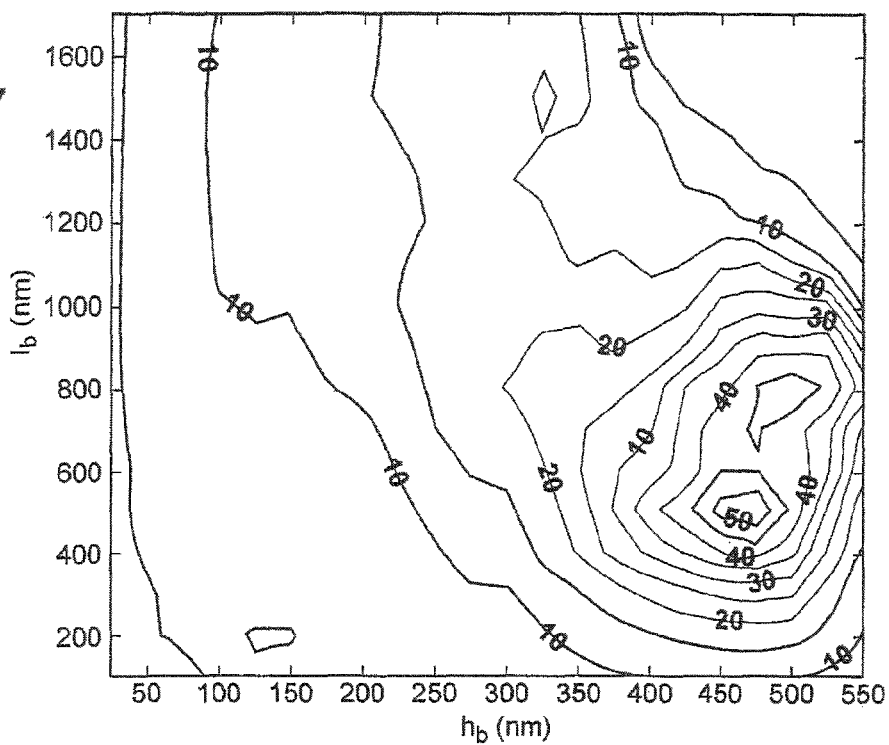
FIG. 7 is a map of the maximum value of a cost function F as a function of the height and of the width of the inclusions in an optical filter of the invention.

Reference is made below to FIG. 7 which, for an optical filter of the invention, shows the maximum value of a cost function F as a function of the height $h_b$ of the inclusions (plotted along the abscissa axis) and of their width $l_b$ (plotted up the ordinate axis).

The cost function is defined as follows:

$$F(h_b, l_b) = \frac{T_{35}^2(h_b, l_b)}{T_{23}(h_b, l_b)T_{57}(h_b, l_b)}$$

where $T_{35}(h_b, l_b)$, $T_{23}(h_b, l_b)$, and $T_{57}(h_b, l_b)$ correspond to the maximum transmission of a filter having the characteristics given below in the following spectral bands respectively [3 µm to 5 µm]; [2 µm to 3 µm]; and [5 µm to 7 µm]. Given the way this cost function F is defined, it is at a maximum for a given inclusion dimension when there is strong rejection away from the main transmission peak appearing in the [3 µm to 5 µm] spectral band. Thus, this cost function reaches a value greater than 50 for $h_b$=475 nm and $l_b$=500 nm.

FIG. 7 was obtained for a filter of the invention having reflective elements made of gold and separated by a grating of parallel lines. The period P of the grating was 1760 nm, the width l of the slits was 360 nm, and the height of the slits was 50 nm.

The optical filter had a support layer of height $h_h$ equal to 575 nm. The support layer was made of silicon and presented $SiO_2$ inclusions of width $l_b$ and height $h_b$.

The support layer was deposited on a layer of $SiO_2$ presenting a height of 700 nm, itself deposited on a substrate of silicon.

Figure 8:
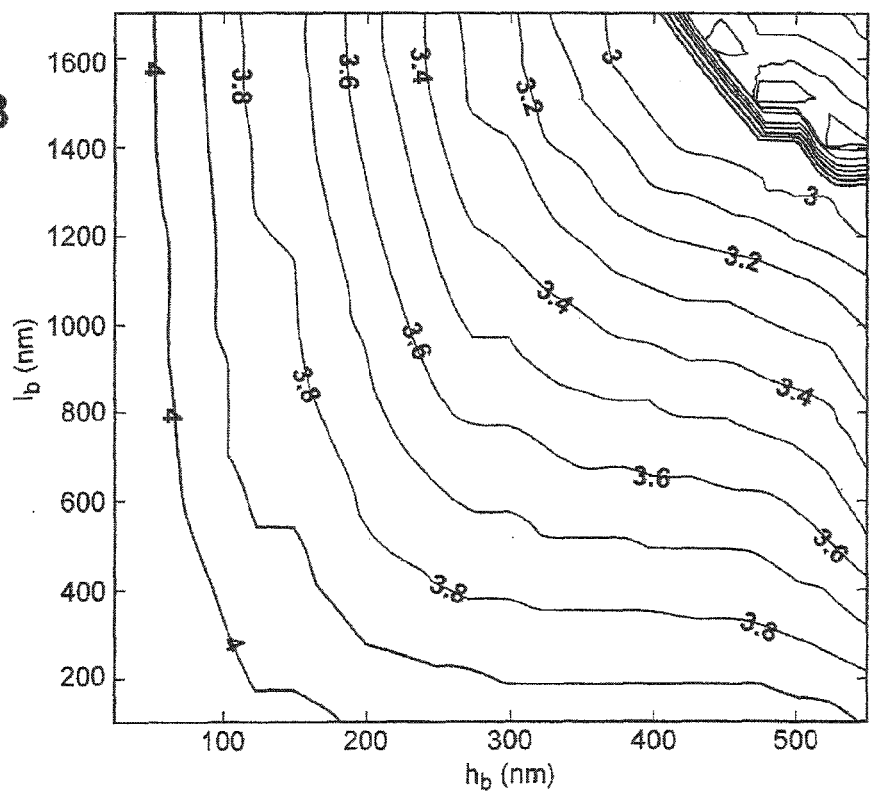
FIG. 8 is a map of the resonance wavelength as a function of the height and of the width of the inclusions in the filter of the invention used for preparing FIG. 7.

Including the inclusions serves to vary the resonance wavelength of the filter, which depends on the values of $h_b$ and $l_b$. Thus, FIG. 8 shows the value of the resonance wavelength as a function of $h_b$ and of $l_b$.

FIG. 7 shows that good rejection is obtained for a value of $h_b$ lying in the range $0.5h_h$ to $h_h$ or indeed in the range $0.5h_h$ to $0.95h_h$ and for values of $l_b$ lying in the range 0.05P to 0.75P. Rejection is optimized for a value of $l_b$ equal to 0.28P and a value of $h_b$ equal to $0.8h_h$. These values are compatible with those mentioned above, given that they are obtained by simulation.

Thus, the optical filter of the invention presents numerous advantages over optical filters of the prior art.

Firstly, it presents very good rejection over a very wide spectral range.

The optical filter of the invention may include a support layer made of a combination of Si and of $SiO_2$, in particular when the filter is for use at wavelengths situated in the range 1 µm to 8 µm. The optical filter can then be made easily using complementary metal oxide semiconductor (CMOS) technology, thereby enabling its fabrication costs to be reduced.

Optical filters of the invention also provide good transmission, typically higher than 70%, over a narrow spectral range.

They present good angular insensitivity concerning the position of the resonance wavelength and the transmission of the filters, to an angle of about 10°.

Finally, filters of the invention are selective in transmission (bandpass) and in reflection (band stop) and they are compact.

The reference signs inserted after the technical characteristics that appear in the claims are provided solely to facilitate understanding of the claims and not to limit their scope.

What is claimed is:

1. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements.

2. A detector for detecting electromagnetic radiation in a predetermined range of wavelengths, the detector including a detection circuit sensitive to said range of wavelengths, and includes an optical filter according to claim 1.

3. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the difference between the two refractive indices $n_h$ and $n_b$ is greater than or equal to $0.25n_h$.

4. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the height $h_h$ of the support layer is such that:

$$0.85 \frac{\lambda}{2n_h} \leq h_h \leq 1.5 \frac{\lambda}{2n_h}$$

where $\lambda$ is a wavelength in the predetermined range of wavelengths.

5. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the refractive index $n_h$ is greater than or equal to $(5/3)n_{max}$, where $n_{max}$ is the highest refractive index of the surrounding materials.

6. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, including a substrate, with a layer made of a material having refractive index less than $n_h$ being arranged between the support layer and the substrate.

7. An optical frequency filter comprising a support lager having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the width of the slits of said at least one periodic grating is less than one-third the period P of the grating.

8. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$, and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the reflective elements are made of metal and have a height lying between the skin thickness of the metal and $\lambda/10n$, where n is the refractive index of the material included in the slits and $\lambda$ is a wavelength in the predetermined range of wavelengths.

9. An optical frequency filter comprising a support layer having reflective elements formed thereon, the reflective elements defining at least one periodic grid of substantially parallel slits, the period P, the height h, and the width l of the slits being selected in such a manner that the reflective elements form a wavelength-selective structure for a wavelength lying in a determined range of wavelengths, wherein the support layer is made of a material of refractive index $n_h$ and includes inclusions of a material of refractive index $n_b$, where $n_b$ is strictly less than $n_h$, these inclusions being flush with the surface of the support layer opposite from its surface on which the reflective elements are formed, and presenting a height $h_b$ such that $0.5h_h \leq h_b \leq 1h_h$, where $h_h$ is the height of the support layer, and a width $l_b$ such that $0.05P \leq l_b \leq 0.75P$, with each inclusion being situated at least in part between two reflective elements, wherein the height $h_b$ of the inclusions is advantageously such that $0.5h_h \leq h_b \leq 0.95h_h$.

\* \* \* \* \*